United States Patent
Lim

(10) Patent No.: US 8,054,685 B2
(45) Date of Patent: Nov. 8, 2011

(54) METHOD OF PROGRAMMING NONVOLATILE MEMORY DEVICE

(75) Inventor: Sang Oh Lim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 144 days.

(21) Appl. No.: 12/650,658

(22) Filed: Dec. 31, 2009

(65) Prior Publication Data

US 2010/0195385 A1    Aug. 5, 2010

(30) Foreign Application Priority Data

Feb. 2, 2009    (KR) .................. 10-2009-0008062

(51) Int. Cl.
*G11C 11/34* (2006.01)
(52) U.S. Cl. .................. 365/185.03; 365/185.24
(58) Field of Classification Search ............. 365/185.03, 365/185.24
See application file for complete search history.

(56) References Cited

U.S. PATENT DOCUMENTS

| | | | | |
|---|---|---|---|---|
| 6,154,162 A | * | 11/2000 | Watson et al. ............ | 341/150 |
| 2008/0158953 A1 | * | 7/2008 | Wang et al. ............ | 365/185.03 |
| 2009/0161443 A1 | * | 6/2009 | Yang et al. ............ | 365/189.05 |
| 2009/0213652 A1 | * | 8/2009 | Park et al. ............ | 365/185.03 |

FOREIGN PATENT DOCUMENTS

| KR | 1020050094569 | 9/2005 |
|---|---|---|
| KR | 1020090002621 | 1/2009 |

OTHER PUBLICATIONS

Notice of Allowance issued from Korean Intellectual Property Office on Feb. 24, 2011.

* cited by examiner

*Primary Examiner* — Michael Tran
(74) *Attorney, Agent, or Firm* — IP & T Group LLP

(57) ABSTRACT

A method of sequentially performing a LSB program operation and an MSB program operation of a nonvolatile memory device, wherein the nonvolatile memory device comprises multi-level memory cells each configured to store two pieces of bit information and page buffers each coupled to a bit line coupled with the memory cells and configured to comprise a first latch coupled to first and second nodes and a second latch coupled to third and fourth nodes, the method including inputting data of MSBs to the second and fourth nodes and setting data of the second and fourth nodes according to a state of data of LSBs stored in the memory cells, and precharging the bit line according to a combination of data stored in the first and second latches and performing the MSB program operation according to a state of a LSB program operation stored in the memory cells.

23 Claims, 11 Drawing Sheets

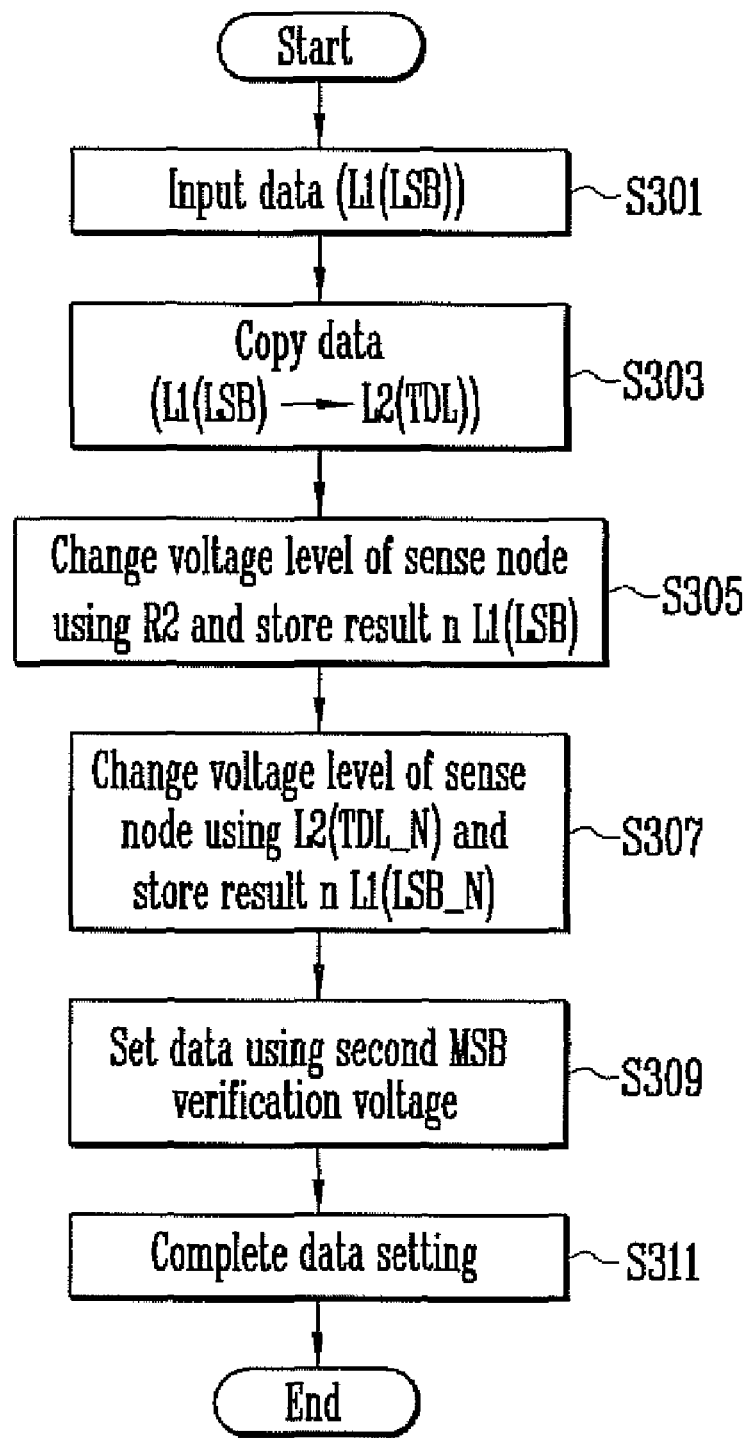

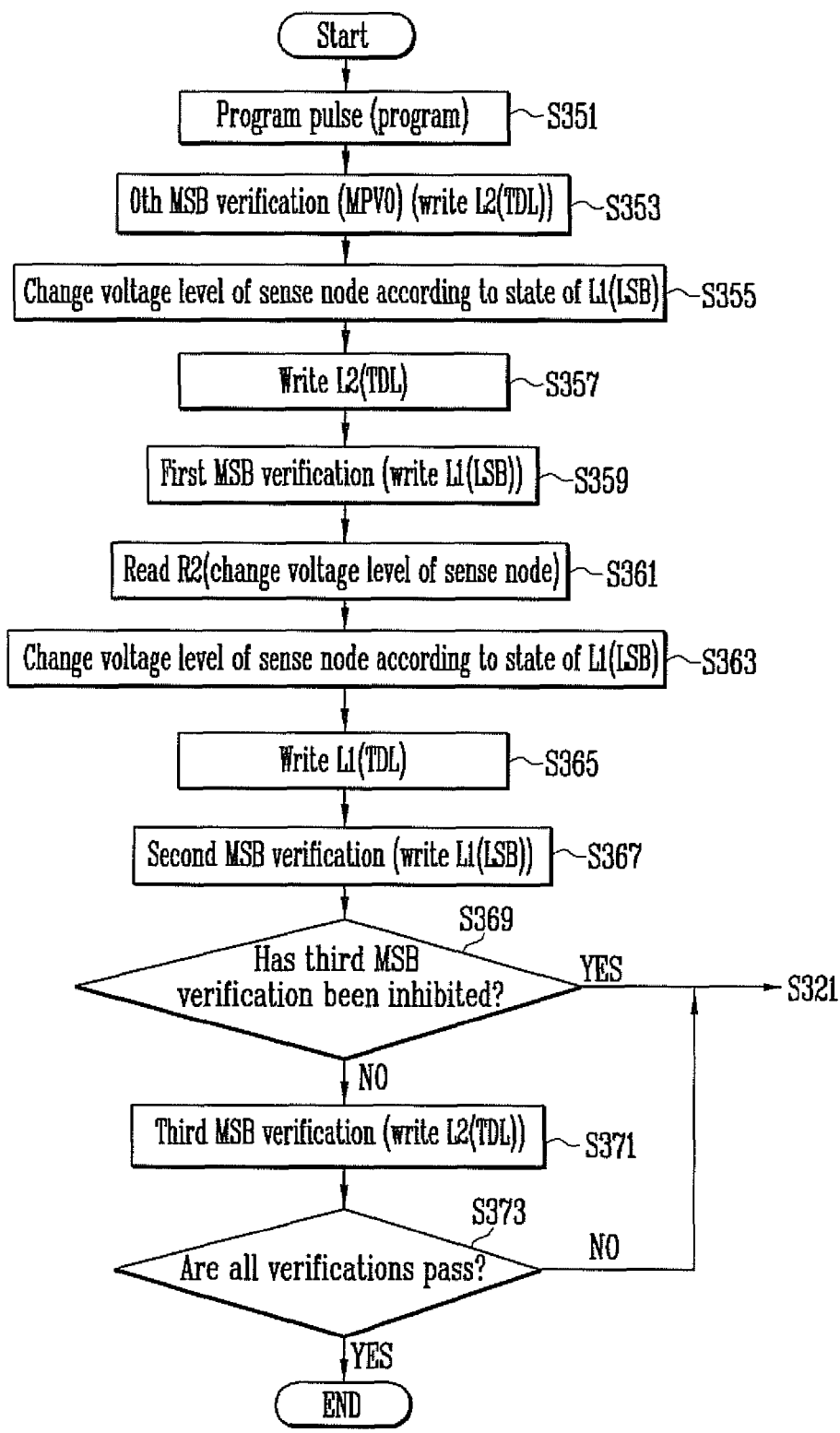

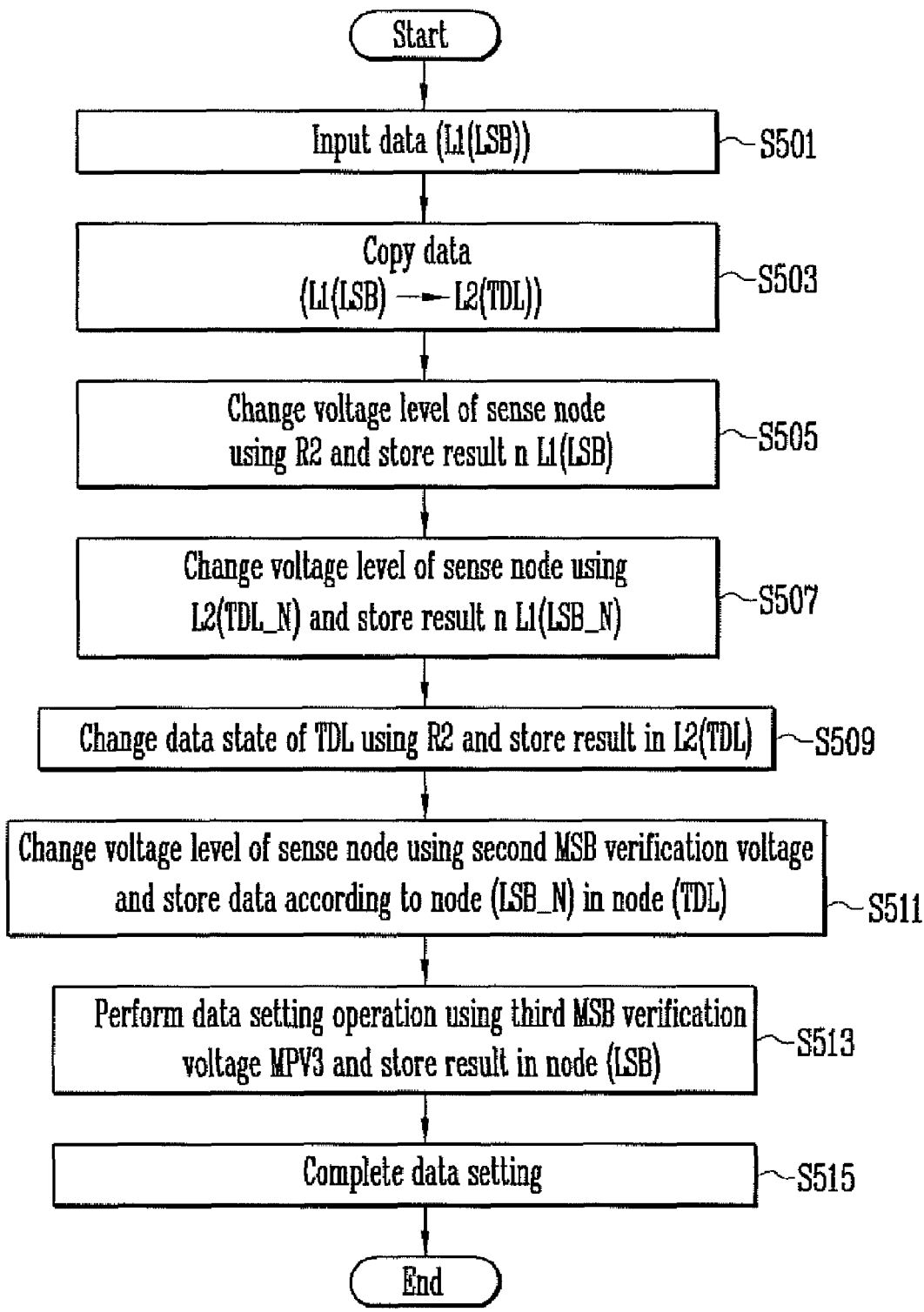

METHOD OF PROGRAMMING NONVOLATILE MEMORY DEVICE

CROSS-REFERENCE TO RELATED APPLICATION

Priority to Korean patent application number 10-2009-0008062 filed on Feb. 2, 2009, the entire disclosure of which is incorporated by reference herein, is claimed.

BACKGROUND

One or more embodiments relate to a nonvolatile memory device and, more particularly, to a method of programming a nonvolatile memory device which is capable of performing operations using a reduced number of latches in a page buffer.

A nonvolatile memory device includes a memory cell array, a row decoder, a page buffer unit, etc. The memory cell array includes a plurality of word lines extending in rows, a plurality of bit lines extending in columns, and a plurality of cell strings corresponding to the respective bit lines.

The row decoder is coupled to a string selection line, word lines, and a common source line and is placed on one side of the memory cell array. The page buffer unit coupled to the plurality of bit lines is placed on the other side of the memory cell array.

Recently, to further increase the degree of integration of flash memory cells, active research is being done on a multi-bit cell capable of storing data of plural bits in a single memory cell. This type of a memory cell is called a multi-level cell (MLC). A memory cell capable of storing a single bit is called a single level cell (SLC).

In a nonvolatile memory device, the number of latches for sensing data or storing program data is gradually increasing.

In a nonvolatile memory device using MLCs, it is important to narrow a distribution of the threshold voltages of the cells. To control the distribution, a program operation is performed in various manners, such as double verification and reprogram.

In a nonvolatile memory device including MLCs, to meet the number of increased programs, the number of latches of a page buffer for storing data is also increased. Furthermore, since the page buffer occupies a large area in the nonvolatile memory device, the area occupied by the page buffer is increased with an increase in the number of latches.

BRIEF SUMMARY

One or more embodiments relate to a method of programming a nonvolatile memory device, which is capable of performing a double verification operation with a reduced number of latches by using a memory cell as one latch circuit.

According to an aspect of this disclosure, there is provided a method of sequentially performing a least significant bit (LSB) program operation and a most significant bit (MSB) program operation of a nonvolatile memory device, wherein the nonvolatile memory device comprises multi-level memory cells each configured to store two pieces of bit information and page buffers each coupled to a bit line coupled to the memory cells and configured to comprise a first latch coupled to first and second nodes and a second latch coupled to third and fourth nodes, the method including a data setting step of inputting data of MSBs to the second and fourth nodes and setting data of the second and fourth nodes according to a state of data of LSBs stored in the memory cells, and a bit line precharge step of precharging the bit line according to a combination of data stored in the first and second latches and performing the MSB program operation according to a state of a LSB program operation stored in the memory cells.

The data setting step includes the steps of inputting the data of MSBs to the second node, copying the data of the second node to the fourth node, changing the data of the second node according to a state of the data stored in the memory cells read using a first read voltage, and changing a voltage level of a sense node, which was previously changed according to a result of the data read using the first read voltage, according to a state of data stored in the third node, and then changing data of the first node according to the changed voltage level of the sense node.

The step of precharging the bit line includes the steps of precharging the bit line to a power source voltage or 0 V according to the data stored in the second node, and precharging the bit line to the power source voltage, a first voltage, or 0 V according to the data stored in the fourth node.

The step of performing the MSB program operation includes a MSB program step of performing a program operation using a first program voltage for the memory cells in response to a program pulse, a first MSB verification step of storing a result of performing a first verification operation using a first verification voltage in the fourth node and then changing the data of the fourth node according to a state of the data stored in the second node, a second MSB verification step of storing a result of performing a second verification operation using a second verification voltage in the second node, and then changing the data of the second node according to a state of the data stored in the fourth node and a program state of the memory cells, determined using the first read voltage, where the second verification voltage is less than the first read voltage, which is less than a third verification voltage, a third MSB verification step of storing a result of performing a third verification operation using a third verification voltage in the second node, a fourth MSB verification step of storing a result of performing a fourth verification operation using a fourth verification voltage in the fourth node, and a finish step of finishing the program operation, if all results of performing the first to fourth MSB verification steps are a pass.

The method further includes the step of changing the data of the second node by performing a data verification operation using the third verification voltage after the data setting step, but before performing the program operation using the first program.

The first MSB verification step includes the steps of performing a first verification operation using the first verification voltage and storing a result of the first verification operation in the fourth node, changing the voltage level of the sense node, depending on the result of the first verification operation, according to a state of the data stored in the second node, and changing the data of the fourth node according to the voltage level of the sense node, after the changing of the voltage level of the sense node.

The second MSB verification step includes the steps of performing a second verification operation using the second verification voltage and storing a result of the second verification operation in the second node, changing the voltage level of the sense node according to a state of the data stored in the memory cells using the first read voltage, changing the voltage level of the sense node according to a state of the data stored in the fourth node, and changing the data of the second node according to the voltage level of the sense node, after the changing of the voltage level of the sense node according to a state of the data stored in the fourth node.

The method further includes repeating a program operation using a second program voltage higher than the first program voltage, if all results of performing the first to fourth MSB verification steps are not a pass, and repeating the first to fourth MSB verification operations.

The first to fourth verification voltages have different voltage levels, which increase in that order.

The first read voltage is higher than the second verification voltage and lower than the third verification voltage.

The fourth MSB verification step is not performed until the program pulse is applied by a predetermined number of times or more, and each time the program operation is performed the program voltage is higher.

The data setting step includes the steps of inputting the data of MSBs to the second node, copying the data of the second node to the fourth node, changing the data of the second node according to a state of the data stored in the memory cells and read using a first read voltage, changing a voltage level of the sense node, changed according to a result of the data read using the first read voltage, according to a state of data stored in the third node, and changing a state of the data stored in the fourth node using the first read voltage.

The step of performing the MSB program operation includes a precharging step of precharging the bit line according to the states of the data stored in the second and fourth nodes, a MSB program step of performing a program operation using a first program voltage for the memory cells in response to a program pulse, a first MSB verification step of performing a first verification operation using a first verification voltage in the fourth node and then changing the data of the fourth node according to the state of the data stored in the second node, a second MSB verification step of performing a second verification operation using a second verification voltage in the second node, and then changing the data of the second node according to the state of the data stored in the fourth node and a program state of the memory cells, determined using the first read voltage, where the second verification voltage is less than the first read voltage, which is less than a third verification voltage, a third MSB verification step of changing the voltage level of the sense node using the third verification voltage, changing the changed voltage level of the sense node according to a state of data stored in the first node, and then changing the data of the fourth node according to the changed voltage level of the sense node, a fourth MSB verification step of changing the data of the second node using a fourth verification voltage, a fifth MSB verification step of changing the data of the fourth node using a fifth verification voltage, and a finishing step of finishing the program operation, if all results of performing the first to fifth MSB verification steps are a pass.

The method further includes changing the data of the fourth node by performing a data verification operation using the third verification voltage after the data setting step is performed, but before the performing of the program operation using the first program voltage, and changing the data of the second node by performing a data verification operation using the fourth verification voltage.

The first MSB verification step includes the steps of performing a first verification operation using the first verification voltage and storing a result of the first verification operation in the fourth node, changing the voltage level of the sense node, depending on the result of the first verification operation, according to the state of the data stored in the second node, changing the data of the fourth node according to the voltage level of the sense node, after the changing of the voltage level of the sense node according to the state of the data stored in the second node, and changing the voltage level of the sense node using the first read voltage, then changing the voltage level of the sense node according to a state of data stored in the first node, and then changing the data of the fourth node according to the voltage level of the sense node.

The second MSB verification step includes the steps of changing the voltage level of the sense node using the second verification voltage, changing the voltage level of the sense node according to the state of the data stored in the fourth node, and changing the data of the second node according to the voltage level of the sense node, after the changing of the voltage level of the sense node according to the state of the data stored in the fourth node.

The third MSB verification step includes the steps of changing the voltage level of the sense node using the third verification voltage, changing the voltage level of the sense node according to the state of the data stored in the first node, and changing the data of the fourth node according to the voltage level of the sense node, after the changing of the voltage level of the sense node according to the state of the data stored in the first node.

The method further includes the steps of precharging the bit line and performing a program operation using a second program voltage more than the first program voltage, if all results of performing the first to fifth MSB verification steps are not a pass, and repeating the first to fifth MSB verification operations.

The first to fifth verification voltages have different voltage levels, which increase in that order.

The first read voltage is higher than the second verification voltage and lower than the third verification voltage.

The fifth MSB verification step is not performed until the program pulse is applied by a predetermined number of times or more, and each time the program operation is performed the program voltage is higher.

According to another aspect of this disclosure, there is provided a method of sequentially performing a LSB program operation and an MSB program operation of a nonvolatile memory device, wherein the nonvolatile memory device comprises multi-level memory cells each configured to store two pieces of bit information and page buffers each coupled to a bit line coupled to the memory cells and configured to comprise a first latch coupled to first and second nodes and a second latch coupled to third and fourth nodes, the method comprising a data setting step of inputting data of MSBs to the second and fourth nodes and setting data of the second and fourth nodes according to a state of data of LSBs stored in the memory cells, a bit line precharge step of precharging the bit line to a power supply voltage, a first voltage, or 0 V according to states of the data stored in the second and fourth nodes, a first MSB verification step of performing a program operation using a first program voltage in response to a program pulse, performing a first verification operation using a first verification voltage in the fourth node, and then changing the data of the fourth node according to the state of the data stored in the second node, a second MSB verification step of performing a second verification operation using a second verification voltage for the second node, and changing the data of the second node according to the state of the data stored in the fourth node and a program state of the memory cells, determined using the first read voltage, where the second verification voltage is less than the first read voltage, which is less than a third verification voltage, a third MSB verification step of performing a third verification operation using a third verification voltage for the second node, a fourth MSB verification step of performing a fourth verification operation using a fourth verification voltage for the fourth node, and a finishing step of finishing the program operation, if all results of performing the first to fourth MSB verification steps are a pass.

According to yet another aspect of this disclosure, there is provided a method of sequentially performing a LSB program operation and an MSB program operation of a nonvolatile memory device, wherein the nonvolatile memory device comprises multi-level memory cells each configured to store two pieces of bit information and page buffers each coupled to a bit line coupled to the memory cells and configured to comprise a first latch coupled to first and second nodes and a second latch coupled to third and fourth nodes, the method comprising a data setting step of inputting data of MSBs to the second and fourth nodes and setting data of the second and fourth nodes according to a state of data of LSBs stored in the memory cells, a bit line precharge step of precharging the bit line to a power supply voltage, a first voltage, or 0 V according to states of the data stored in the second and fourth nodes, a first MSB verification step of performing a program operation using a first program voltage in response to a program pulse, performing a first verification operation using a first verification voltage in the fourth node, and then changing the data of the fourth node according to the state of the data stored in the second node, a second MSB verification step of performing a second verification operation using a second verification voltage for the second node, and changing the data of the second node according to the state of the data stored in the fourth node and a program state of the memory cells, determined using the first read voltage, where the second verification voltage is less than the first read voltage, which is less than a third verification voltage, a third MSB verification step of changing the voltage level of the sense node using the third verification voltage, then changing the voltage level of the sense node according to a state of data stored in the first node, and then changing the data of the fourth node according to the voltage level of the sense node, a fourth MSB verification step of changing the data of the second node using a fourth verification voltage, a fifth MSB verification step of changing the data of the fourth node using a fifth verification voltage, and a finishing step of finishing the program operation, if all results of performing the first to fifth MSB verification steps are a pass.

BRIEF DESCRIPTION OF THE DRAWINGS

FIG. 3A is a flowchart illustrating a data setting operation in an MSB page program of the nonvolatile memory device according to a first embodiment of this disclosure;

FIG. 3C is a flowchart illustrating a program operation subsequent to the bit line voltage setting operation shown in FIG. 3B;

FIG. 5A is a flowchart illustrating a data setting operation in the MSB page program of the nonvolatile memory device according to the second embodiment of this disclosure;

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1:
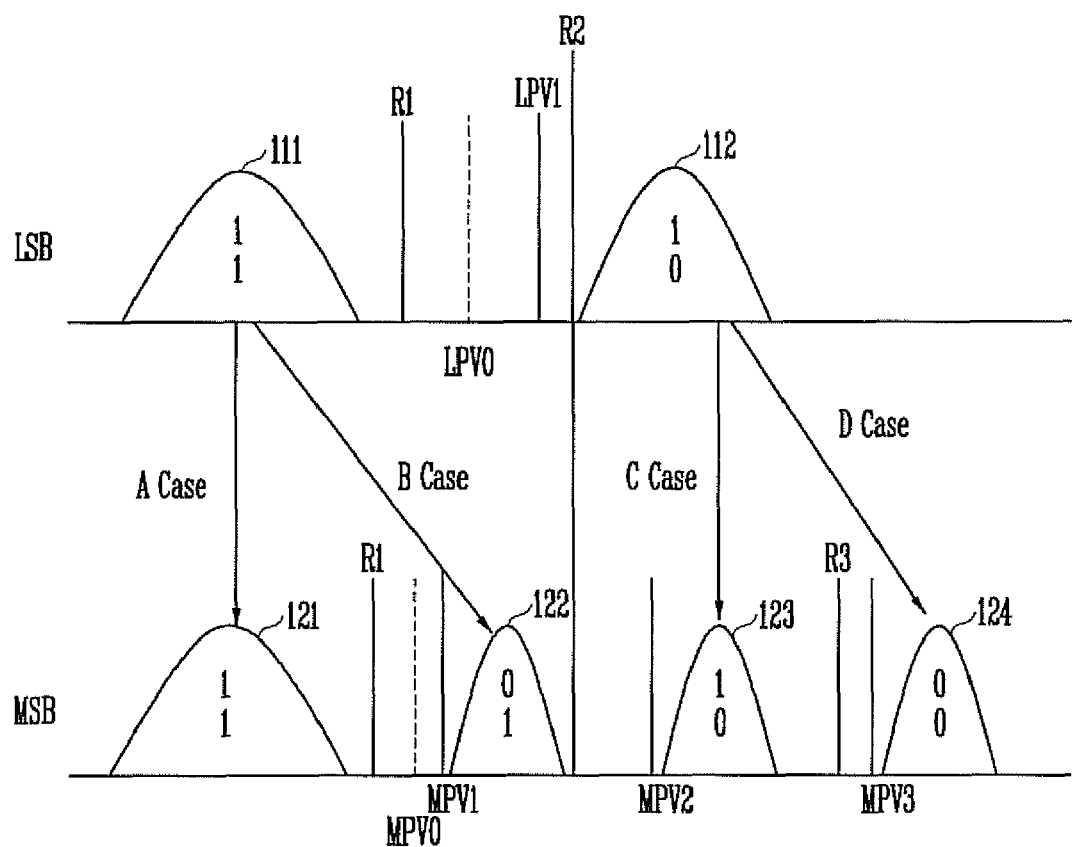
FIG. 1 is a diagram illustrating a shift of threshold voltage distributions according to a program operation of a nonvolatile memory device.

FIG. 1 is a diagram illustrating a shift of threshold voltage distributions according to the program operation of a nonvolatile memory device.

In more detail, FIG. 1 is a diagram illustrating threshold voltage distributions when the program operation of a nonvolatile memory device, in particular, a nonvolatile memory device including MLCs each capable of storing two bits is performed. The MLC capable of storing data of two bits includes two logic pages, including a least significant bit (LSB) page and a most significant bit (MSB) page. When each of the pages is programmed, a threshold voltage distribution shifts.

First, when the LSB page program is performed, the threshold voltages of some memory cells, having a first threshold voltage distribution 111 (i.e., an erase state), shift, resulting in a second threshold voltage distribution 112.

Furthermore, the threshold voltages of memory cells, having the first and second threshold voltage distributions 111, 112, respectively shift to third and fourth threshold voltage distributions 121, 122 and fifth and sixth threshold voltage distributions 123, 124, by means of an MSB page program using a reprogram method.

Here, FIG. 1 shows that when the LSB page program is performed, a $0^{th}$ LSB verification voltage LPV0 and a first LSB verification voltage LPV1 are used for a double verification operation, and when the MSB page program is performed, a $0^{th}$ MSB verification voltage MPV0 and a first MSB verification voltage MPV1 are used in order to perform double verification for memory cells having the fourth threshold voltage distribution 122. FIG. 1 also shows first to third read voltages R1 to R3.

The nonvolatile memory device having threshold voltage distributions shifting as described above is constructed as follows.

Figure 2A:
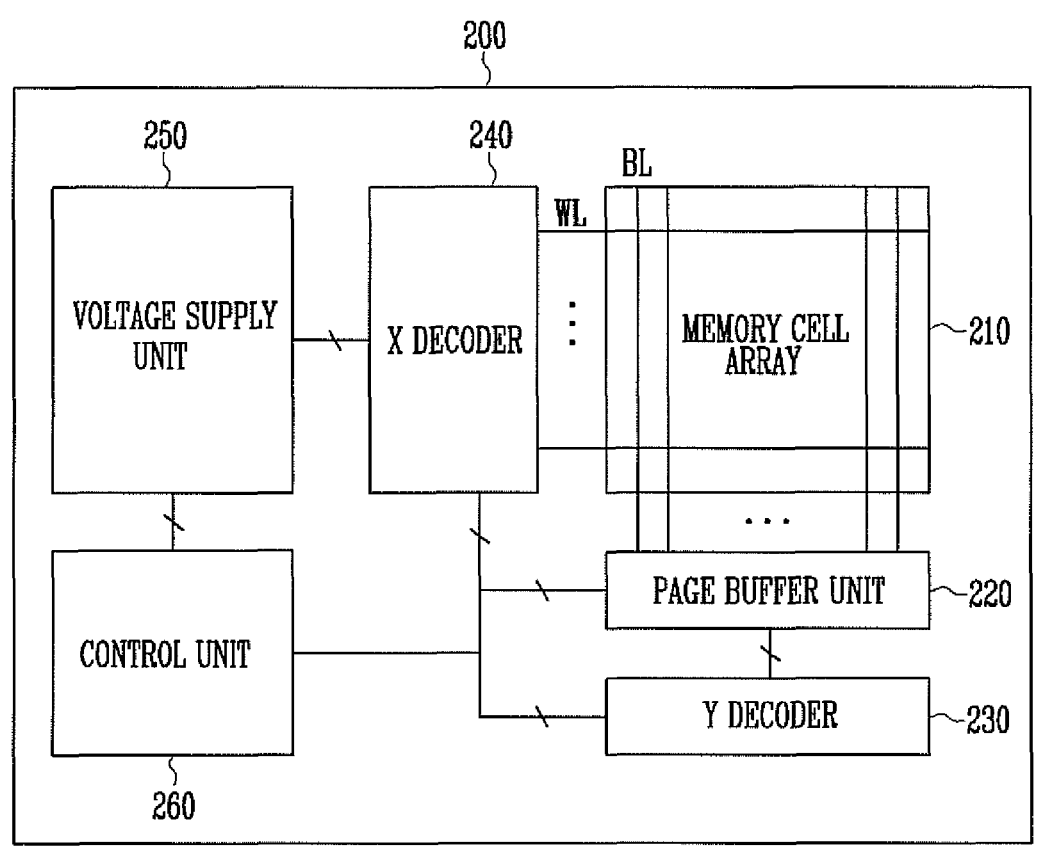
FIG. 2A is a block diagram of a nonvolatile memory device according to an embodiment of this disclosure.

FIG. 2A is a block diagram of the nonvolatile memory device according to an embodiment of this disclosure.

Referring to FIG. 2A, the nonvolatile memory device 200 includes a memory cell array 210, a page buffer unit 220, a Y decoder 230, an X decoder 240, a voltage supply unit 250, and a control unit 260.

The memory cell array 210 includes memory cells for storing data. The memory cells are coupled by bit lines and the word lines thereby forming memory blocks.

The page buffer unit 220 includes page buffers PB. Each of the page buffers PB is coupled to bit lines and is configured to temporarily store data to be stored in a selected memory cell, or to read data stored in a memory cell and store the read data.

The Y decoder 230 is configured to provide the page buffers PB with a data IO path. The X decoder 240 is configured to select a memory block and to couple the word lines of a selected memory block with a global word line for supplying operating voltages to the word lines.

The voltage supply unit 250 is configured to generate the operating voltages for program, erase, and read operations, and to supply them to the global word line. The control unit 260 is configured to control the program, erase, and read operations.

Furthermore, the control unit 260 is configured to recognize the memory cell as a single latch, and together with the latches of the page buffer PB, is used for a verification operation.

Figure 2B:
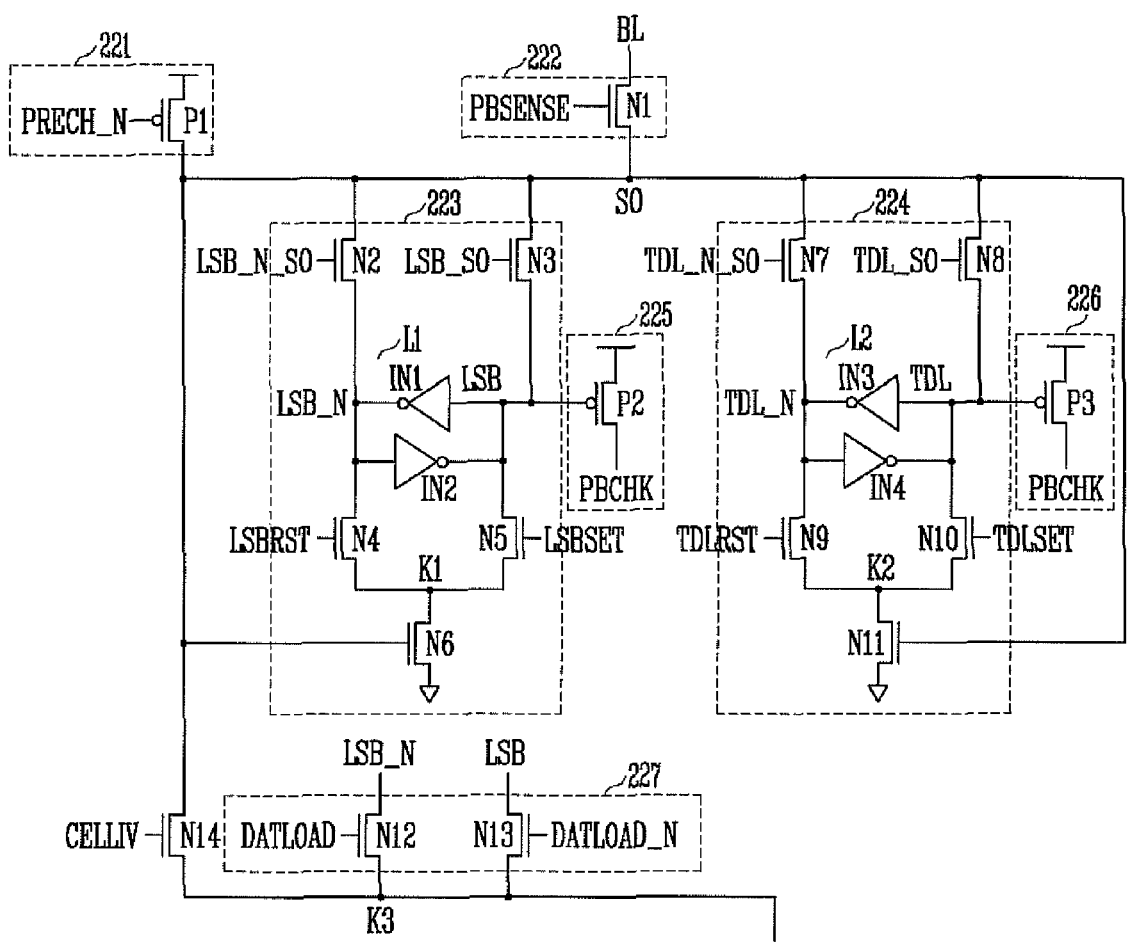
FIG. 2B is a circuit diagram of a page buffer of a page buffer unit shown in FIG. 2A.

FIG. 2B is a circuit diagram of a page buffer of the page buffer unit shown in FIG. 2A.

Referring to FIG. 2B, the page buffer PB includes a precharge unit 221, a sense unit 222, first and second latch units 223, 224, first and second verification operation units 225, 226, and a data input unit 227.

The precharge unit 221 is configured to precharge the sense node SO with a power source voltage. The sense unit 222 is coupled to the bit line BL and is configured to sense a bit line voltage and transfer it to the sense node SO.

The first and second latch units 223, 224 are configured to temporarily store data. The first and second verification operation units 225, 226 are configured to output respective verification operation signals according to data stored in the first and second latch units 223, 224. Furthermore, the data input unit 227 is configured to store, data received via the Y decoder 230, in the first latch unit 223.

The circuit of the page buffer PB is described in more detail below.

The precharge unit 221 includes a first PMOS transistor P1. The sense unit 222 includes a first NMOS transistor N1. The first latch unit 223 includes second to sixth NMOS transistors N2 to N6 and first and second inverters IN1, IN2. The second latch unit 224 includes seventh to eleventh NMOS transistors N7 to N11 and third and fourth inverters IN3, IN4.

The first verification operation unit 225 includes a second PMOS transistor P2. The second verification operation unit 226 includes a third PMOS transistor P3. The data input unit 227 includes twelfth and thirteenth NMOS transistors N12, N13. The page buffer PB further includes a fourteenth NMOS transistor N14.

The first PMOS transistor P1 is coupled between the power supply voltage and the sense node SO. A precharge control signal PRECH_N is inputted to the gate of the first PMOS transistor P1.

The first NMOS transistor N1 is coupled between the bit line BL and the sense node SO. A sense control signal PBSENSE is inputted to the gate of the first NMOS transistor N1.

The second NMOS transistor N2 is coupled between the sense node SO and a node LSB_N. The third NMOS transistor N3 is coupled between the sense node SO and a node LSB. Furthermore, a first control signal LSB_N_SO is inputted to the gate of the second NMOS transistor N2, and a second control signal LSB_SO is inputted to the gate of the third NMOS transistor N3.

The first and second inverters IN1, IN2 are coupled in the form of a latch circuit between the node LSB_N and the node LSB, thus constituting a first latch L1.

The fourth NMOS transistor N4 is coupled between the node LSB_N and a node K1, and the fifth NMOS transistor N5 is coupled between the node LSB and the node K1. Furthermore, an LSB reset signal LSBRST is inputted to the gate of the fourth NMOS transistor N4, and an LSB set signal LSBSET is inputted to the gate of the fifth NMOS transistor N5.

The sixth NMOS transistor N6 is coupled between the node K1 and a ground node, and the gate of the sixth NMOS transistor N6 is coupled to the sense node SO.

The seventh NMOS transistor N7 is coupled between the sense node SO and a node TDL_N, and the eighth NMOS transistor N8 is coupled between the sense node SO and a node TDL. Furthermore, a third control signal TDL_N_SO is inputted to the gate of the seventh NMOS transistor N7, and a fourth control signal TDL_SO is inputted to the gate of the eighth NMOS transistor N8.

The third and fourth inverters IN3, IN4 are coupled between the node TDL_N and the node TDL in the form of a latch circuit, thus constituting a second latch L2.

The ninth NMOS transistor N9 is coupled between the node TDL_N and a node K2, and the tenth NMOS transistor N10 is coupled between the node TDL and the node K2. A TDL reset signal TDLRST is inputted to the gate of the ninth NMOS transistor N9, and a TDL set signal TDLSET is inputted to the gate of the tenth NMOS transistor N10.

The eleventh NMOS transistor N11 is coupled between the node K2 and a ground node, and the gate of the eleventh NMOS transistor N11 is coupled to the sense node SO.

The second PMOS transistor P2 is coupled to the power supply voltage and a PB check terminal PBCHK, and the gate of the second PMOS transistor P2 is coupled to the node LSB. Furthermore, the third PMOS transistor P3 is coupled to the power supply voltage and the PB check terminal PBCHK, and the gate of the third PMOS transistor P3 is coupled to the node TDL. The second and third PMOS transistors P2, P3 operate in response to respective states of data stored in the node LSB and the node TDL and transfer the power supply voltage to the PB check terminal PBCHK as a PB check signal.

The twelfth NMOS transistor N12 is coupled between the node LSB_N and a node K3, and the thirteenth NMOS transistor N13 is coupled between the node LSB and the node K3. Furthermore, a first data input signal DATLOAD is inputted to the gate of the twelfth NMOS transistor N12, and a second data input signal DATLOAD_N is inputted to the gate of the thirteenth NMOS transistor N13.

The fourteenth NMOS transistor N14 is coupled between the sense node SO and the node K3, and a control signal CELLIV is inputted to the gate of the fourteenth NMOS transistor N14.

A process of performing a double verification operation using the above page buffer PB is described below.

After the LSB program is completed in FIG. 1, operations performed according to respective cases of the threshold voltage distributions when performing the MSB program, such that the threshold voltage distributions shift to the third to sixth threshold voltage distributions 121 to 124 are as follows.

Bit lines coupled to the memory cells having the third threshold voltage distribution 121 should be program-inhibited, and bit lines coupled to memory cells having the fourth threshold voltage distribution 122 should experience a double verification operation.

Furthermore, bit lines coupled to the memory cells having the fifth threshold voltage distribution 123 should experience a reprogram operation, and bit lines coupled to the memory cells having the sixth threshold voltage distribution 124 should experience a normal program operation.

Assuming that the case in which program-inhibition should be performed is a first case A, the case in which the double verification operation should be performed is a second case B, the case in which the reprogram operation should be performed is a third case C, and the case in which the normal program should be performed is a fourth case D, voltages should be applied to the bit lines according to the different cases.

First, the power supply voltage Vcc is applied to the bit lines corresponding to the first case A.

In relation to the bit lines corresponding to the second case B, 0 V is first applied. Then, a first voltage AV is applied to the bit lines, after a verification operation using the $0^{th}$ MSB verification voltage MPV0, is a pass. Next, the power supply voltage Vcc is applied, after a verification operation, using the first MSB verification voltage MPV1, is a pass.

In relation to the bit lines corresponding to the third case C, the first voltage AV is first applied so that a fast program operation is performed. Then, the power supply voltage Vcc is applied, after a verification operation, using a second MSB verification voltage MPV2, is a pass.

Finally, in relation to the bit lines corresponding to the fourth case D, 0 V is first applied. Then, the power supply voltage Vcc is applied, after a verification operation, using a third MSB verification voltage MPV3, is a pass.

The voltage levels of the bit lines should be controlled by the two latches L1, L2 of the page buffer PB shown in FIG. 2B. That is, the power supply voltage Vcc is applied to the bit lines through the first latch L1, and the first voltage AV is applied to the bit lines through the second latch L2.

To this end, as shown in Table 1 below, different states are set in the node LSB and the node TDL in order to set the bit lines on a case basis.

TABLE 1

|  | LSB, TDL | BL VOLTAGE |
|---|---|---|
| CASE A | 1, 1 | Vcc |
| CASE B | 0, 0 | 0 V |
| CASE C | 0, 1 | AV |
| CASE D | 1, 0 | 0 V |

When the data of the first and second latches L1, L2 are set as shown in Table 1, desired voltages can be applied to the bit lines.

As defined above, the data of the first and second latches L1, L2 are changed while respective verification operations are performed.

In more detail, in the second case B, a program operation is performed by setting the data of the first and second latches L1, L2 to 0,0, respectively, and applying 0 V to the bit lines. When a verification operation, using the $0^{th}$ MSB verification voltage MPV0, is a pass, the bit line voltage can be changed into the first voltage AV by changing the data of the second latch L2 to '1'.

In the second case B, when a verification operation, using the first MSB verification voltage MPV1, is a pass, the bit line voltage can be changed into the power supply voltage Vcc by changing the data of the first latch L1 to '1'.

In the third case C, a program operation is performed by applying the first voltage AV to the bit lines with the data of the first and second latches L1, L2 being set to 0,1. When a verification operation, using the second MSB verification voltage MPV2, is a pass, the data of the first latch L1 is changed to '1' so that the bit line voltage becomes the power supply voltage Vcc.

Finally, in the fourth case D, 0 V is first applied to the bit lines with the data of the first and second latches L1, L2 being set to 1,0. When a verification operation using the third MSB verification voltage MPV3 is a pass as a program operation is performed, the data of the second latch L2 is changed to '1' so that the bit line voltage becomes the power supply voltage Vcc.

That is, to change a bit line voltage in each case, a program operation can be performed by changing only the data of the first and second latches L1, L2.

However, if a program operation is performed as described above, a problem is generated. In other words, while performing a verification operation, the data of a latch can be changed unwantedly, leading to errors. For example, when a verification operation, using the $0^{th}$ MSB verification voltage MPV0, is a pass, the data of the second latch L2 should be changed to '1'. However, in the third and fourth cases C, D, a verification operation, using the $0^{th}$ MSB verification voltage MPV0, is always a pass. Thus, in the third and fourth cases C, D, although a verification operation, using the $0^{th}$ MSB verification voltage MPV0, is a pass, the data of the second latch L2 should not be changed.

To address this problem, a method of storing data using another latch in order to retain the data is for the most part used.

However, the embodiments of this disclosure propose a method of using a memory cell as one latch in order to perform a normal program operation for all four of the cases while not changing their data states using the two latches as shown in FIG. 2B.

To perform a normal verification operation, in the case in which a verification operation using each verification voltage is a pass, there is a need for a procedure of changing the data of a latch and restoring the changed data.

First, a case in which a verification operation using the $0^{th}$ MSB verification voltage MPV0 is a pass corresponds to the second to fourth cases B, C, and D. Here, there is no problem in the second case B because the data of the second latch L2 is normally changed to '1'.

Error does not occur in the third case C although '1' is written into the second latch L2 again because the data of the second latch L2 is already '1'.

Next, the fourth case D is problematic because the data of the second latch L2 can be changed to '1' in the state in which data '0' has not been programmed into the second latch L2. To solve this problem, data stored in the first latch L1 is used.

That is, after changing the data of the node TDL of the second latch L2 using the $0^{th}$ MSB verification voltage MPV0, a voltage level of the sense node SO is changed according to a state of the data stored in the node LSB of the first latch L1, and the changed data is written into the node TDL again.

In more detail, when a verification operation using the $0^{th}$ MSB verification voltage MPV0 is a pass, the data states of the second latches L2 of the second to fourth cases B, C, and D are all changed to '1'.

Next, the data of the first latch L1 is transferred to the sense node SO. Since the data of the node LSB is '1001', the data state of the sense node SO becomes '0001'. The reason why the state of the sense node SO is changed into '0001' is that, if the state of the sense node SO is '0', '0' is maintained irrespective of the data of the node LSB, but if the data of the node LSB is '0' when the state of the sense node SO is '1', the state of the sense node SO is changed to '0'.

Accordingly, if data is written into the node TDL with the state of the sense node SO being '0001', the state of the sense node SO is recovered from '1' to '0' only in the fourth case D. That is, when the sense node SO is in a power source voltage of '1', the eleventh NMOS transistor N11 is turned on. Accordingly, the node K2 is coupled to the ground node. At this time, when the TDL set signal TDLSET of a high level is inputted, the data of the second latch L2 can be restored to '0'.

Accordingly, after a verification operation using the $0^{th}$ MSB verification voltage MPV0 is a pass, the data of the second latch L2 is recovered using the data of the first latch L1, thereby being capable of preventing errors from occurring in all of the cases.

Second, a case in which a verification operation using the first MSB verification voltage MPV1 is a pass corresponds to the second to fourth cases B, C, and D. Furthermore, when a verification operation using the first MSB verification voltage MPV1 is a pass, the data of the first latch L1 is changed to '1'.

In the second and fourth cases B, D, although the data of the first latch L1 is changed to '1', there is no error in the first MSB verification voltage MPV1. However, in the third case C, the data of the first latch L1 should not be changed into '1'.

To solve this problem, there is a need for distinguishing between the data states of the second and third cases B, C. The reason that the second case B is recognized as being identical with the third case C is because a verification operation using the $0^{th}$ MSB verification voltage MPV0 has already been a pass and the data of the first and second latches L1, L2 have been changed into 0,1.

In the embodiment of this disclosure, to distinguish between the second and third cases B, C, the data of a memory cell is read. That is, in FIG. 1, the data of a memory cell is read from the second latch L2 using the second read voltage R2.

First, when a verification operation using the first MSB verification voltage MPV1 is a pass, the data of the first latch L1 becomes '1' in the second to fourth cases B, C, and D. Here, in the third case C, the data of the first latch L1 should not be changed to '1'.

Accordingly, after the voltage level of the sense node SO is changed using the second read voltage R2, the voltage level of the sense node SO is changed again according to a state of data stored in the node TDL of the second latch L2, and then written into the first latch L1, thereby correcting an error of the third case C.

That is, when a verification operation using the first MSB verification voltage MPV1 is a pass, the node LSB becomes '1111'. Furthermore, if data is read from the second latch L2 using the second read voltage R2, the state of the sense node SO becomes '0011'.

Furthermore, when the sense node SO is coupled to the node TDL, the state of the sense node SO becomes '0010'. When data is written into the node LSB with the state of the sense node SO being '0010', the state of the data stored in the node LSB is changed from '1111' to '1101'. Accordingly, the data of the third case C can be recovered.

Third, when a verification operation using the second MSB verification voltage MPV2 is performed, the third and fourth cases C, D can become a pass. When the verification operation using the second MSB verification voltage MPV2 is a pass, the data of the first latch L1 is changed to '1'. Here, the fourth case D is not influenced because the data of the first latch L1 is already '1'.

Finally, when a verification operation using the third MSB verification voltage MPV3 is performed, the verification operation is a pass only for the fourth case D, and the data of the second latch L2 is changed to '1'. Accordingly, program and verification operations for all of the cases are completed.

If the verification operation is performed as described above, a double verification operation and a reprogram operation for an MCL capable of storing data of two bits can be sufficiently performed using only two latches as in the case of FIG. 1.

To describe the above in more detail, an MSB page program is described below with reference to FIGS. 1, 2A, and 2B.

FIG. 3A is a flowchart illustrating a data setting operation in the MSB page program of the nonvolatile memory device according to a first embodiment of this disclosure.

The first embodiment relates to a program process in the case in which a double verification operation is performed on the memory cells having the fourth threshold voltage distribution 122. FIG. 3A shows a process of performing the data setting operation for an MSB page program in the state in which an LSB page program has been completed.

First, data is stored in the node LSB of the first latch L1 through the data input unit 227 at step S301. Here, since the LSB page program has already been completed, data stored in the node LSB of the first latch L1 for each of the first to fourth cases A to is '1010'.

Next, the data stored in the node LSB of the first latch L1 is copied to the node TDL of the second latch L2 at step S303. Next, the data stored in the node LSB of the first latch L1 is changed using the second read voltage R2 according to results of reading the memory cells at step S305.

Step S305 is described in detail below. Since the LSB page program for the memory cells has already been completed, the state of the sense node SO in the first to fourth cases A to D becomes '0011' when loading data using the second read voltage R2.

The sixth NMOS transistor N6 is turned on or off according to the state of the sense node SO. Here, when the LSB set signal LSBSET of a high level is inputted, the fifth NMOS transistor N5 is turned on.

Accordingly, with the state of the sense node SO being '0011', the data '1010' stored in the node LSB is changed to '1000'.

Immediately after step S305, the voltage level of the sense node SO is changed according to a state of the data stored in the node TDL_N, and data according to the voltage level of the sense node SO is stored in the node LSB_N at step S307.

Step S307 is described in detail below. In the case in which the data of the node TDL_N is '1' with the state of the sense node SO being '0', it means that the sense node SO is currently being coupled to the bit line BL. Further, a voltage of the node TDL_N is insufficient to change the state of the sense node SO to '1'. Accordingly, when the state of the sense node SO is '0' and the data of the node TDL_N is '1', the sense node SO maintains the state '0'.

Furthermore, when the data of the node TDL_N is '0' with the state of the sense node SO being '1', the voltage level of the sense node SO is discharged toward the node TDL_N. Accordingly, when the state of the sense node SO is '1' and the data of the node TDL_N is '1', the state of the sense node SO is changed to '0'.

That is, only when the states of the sense node SO and the node TDL_N are '1', can the sense node SO maintain the state '1'.

Accordingly, if the state of the sense node SO is '0011' and the data of the node TDL_N is '0101' in each of the first to fourth cases A to D at step S305, the data state of the sense node SO becomes '0001' at step S307.

Furthermore, when the fourth NMOS transistor N4 is turned on in response to the LSB reset signal LSBRST of a high level with the state of the sense node SO being '0001', the data of the node LSB_N is changed from '0111' to '0110'. Accordingly, the data of the node LSB becomes '1001'.

After step S307 is completed, in each of the first to fourth cases A to D, the data of the node LSB is '1001' and the data of the node TDL is '1010'. Accordingly, the data setting operation for the bit line in each of the cases is completed as defined in Table 1.

Here, some of the memory cells that should be programmed to have the fifth threshold voltage distribution 123 may have already been included in the fifth threshold voltage distribution 123.

Accordingly, the data of the memory cells are loaded using the second MSB verification voltage MPV2 and then stored in the node LSB of the first latch L1 at step S309. Thus, the first and second latches L1, L2 of the page buffer PB coupled to the bit line BL coupled to the memory cells that have already been programmed to have the fifth threshold voltage distribution 123 are storing '1'. Consequently, the corresponding memory cells are program-inhibited, and so the data setting operation for the bit line BL is finished at step S311.

After the data setting operation is completed as described with reference to FIG. 3A, a program operation is performed as follows.

Figure 3B:
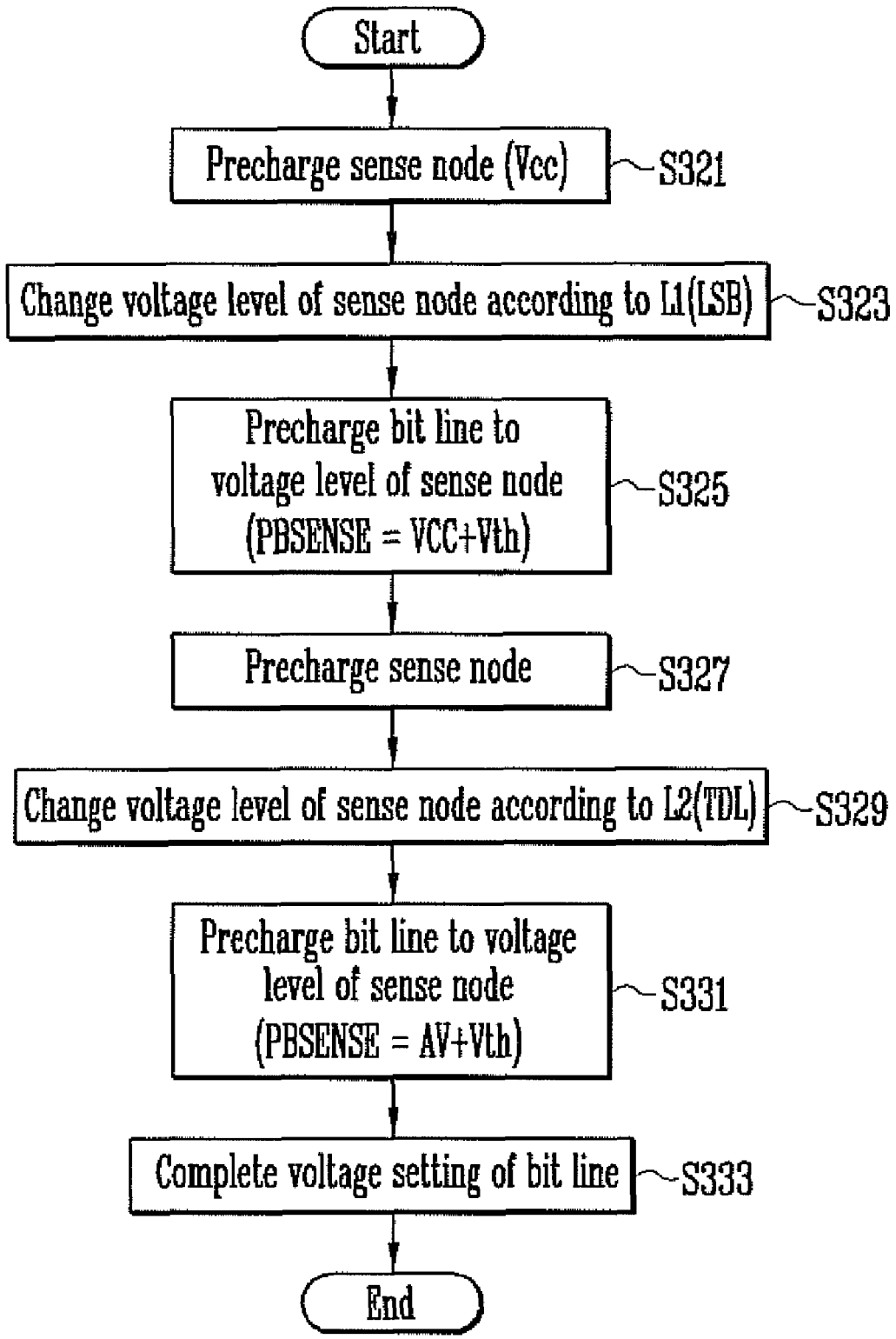
FIG. 3B is a flowchart illustrating a bit line voltage setting operation subsequent to the data setting operation shown in FIG. 3A.

FIG. 3B is a flowchart illustrating a bit line voltage setting operation subsequent to the data setting operation shown in FIG. 3A.

Referring to FIG. 3B, after the data setting operation for the first and second latches L1, L2 in each of the first to fourth cases A to D is completed as in FIG. 3A, a precharge operation for the bit line is started.

To this end, first, the precharge control signal PRECH_N of a low level is applied to thereby precharge the sense node SO to the power supply voltage Vcc at step S321.

Next, the third NMOS transistor N3 is turned on in response to the second control signal LSB_SO of a high level. When the third NMOS transistor N3 is turned on, the state of the sense node SO is changed according to a state of data stored in the node LSB at step S323.

That is, when the sense node SO precharged to the power supply voltage Vcc is coupled to the node LSB, the voltages of the sense nodes SO in the four cases are changed to 'Vcc', '0' V, '0' V, and 'Vcc' according to the data state '1001' stored in the node LSB. After the voltages of the sense nodes SO are changed, the level of the second control signal LSB_SO is changed to a low level, thereby turning off the third NMOS transistor N3.

Next, the sense control signal PBSENSE of a voltage level 'Vcc+Vth' is applied to thereby precharge the bit line at step S325. When the sense control signal PBSENSE of the voltage level 'Vcc+Vth' is applied, the voltage level of the sense node SO is precharged in the bit line without a voltage drop.

That is, the bit lines are precharged to 'Vcc', '0'V, '0'V, and 'Vcc' in the first to fourth cases A to D.

Next, the sense node SO is precharged to the power supply voltage Vcc in response to the precharge control signal PRECH_N of a low level at step S327. Thereafter, the eighth NMOS transistor N8 is turned on in response to the fourth control signal TDL_SO of a high level, and so the voltage level of the sense node SO is changed according to the state of the data stored in the node TDL at step S329.

Here, the voltages of the sense nodes SO are changed into 'Vcc', '0' V, 'Vcc', and '0' V because the data of the node TDL is '1010'. After the voltages of the sense nodes SO are changed, the level of the fourth control signal TDL_SO is changed to a low level, thereby turning off the eighth NMOS transistor N8.

Furthermore, the first NMOS transistor N1 is turned on by applying the sense control signal PBSENSE of an 'AV+Vth' level at step S331.

When the sense control signal PBSENSE of an 'AV+Vth' level is applied, the bit line is precharged to AV even though the voltage level of the sense node SO is the power supply voltage Vcc. Here, AV has a voltage level less than the power supply voltage Vcc. The voltage AV is used to precharge a bit line to a low voltage level so that the bit line is more slowly programmed than other bit lines in order for the memory cells, having the fifth threshold voltage distribution 123, to be reprogrammed.

Accordingly, the voltage levels of the bit lines, being 'Vcc', '0' V, '0' V, and 'Vcc' at step S325, are respectively changed to 'Vcc', '0'V, 'AV', and 'Vcc' at step S331. It can be seen that the voltage levels of the bit lines are set to be identical with those of the first to fourth cases A to D, as defined in Table 1, when the program operations are started.

Consequently, the bit line voltage setting operation for starting a program operation is completed at step S333.

After the bit line voltage setting operation is completed as described above, program and verification operations are performed in response to a program pulse.

FIG. 3C is a flowchart illustrating a program operation subsequent to the bit line voltage setting operation shown in FIG. 3B.

Referring to FIG. 3C, when a program pulse is applied at step S351, a program operation is performed on selected memory cells. The program operation is identical with the program operation of a known nonvolatile memory device.

Next, a verification operation is performed. In the first embodiment of this disclosure, a double verification operation using the $0^{th}$ and first MSB verification voltages MPV0, MPV1 is performed.

First, a verification operation using the $0^{th}$ MPV verification voltage MPV0 is performed, and a result of the verification operation is stored in the node TDL of the second latch L2 at step S353. Next, to recover the data in the fourth case D that is unwantedly changed by the $0^{th}$ MPV verification voltage MPV0, the voltage level of the sense node SO is changed according to a state of the data stored in the node LSB of the first latch L1 at step S355. A program operation is performed on the node TDL of the second latch L2 at step S357. The program operation has been described above, and a detailed description thereof is omitted.

Next, a verification operation using the first MSB verification voltage MPV1 is performed, and a result of the verification operation is stored in the node LSB of the first latch L1 at step S359. Next, data are read using the second read voltage R2, and the voltage level of the sense node SO is changed at step S361. The voltage level of the sense node SO is changed again according to a state of the data stored in the node TDL of the second latch L2 at step S363.

Next, the data of the third case C that have erroneously been changed by the first MSB verification voltage MPV1 are corrected by performing a program operation for the node LSB of the first latch L1 based on the voltage level of the sense node SO, previously changed at step S363, at step S365.

Next, a verification operation using the second MSB verification voltage MPV2 is performed, and a result of the verification operation is written into the node LSB of the first latch L1 at step S367. It is then determined whether a verification operation using the third MSB verification voltage MPV3 is being inhibited at step S369.

The determination in step S369 is made in order to reduce the time that it takes to perform a program operation by precluding the verification operation using the third MSB verification voltage MPVs until the program operation is performed by a predetermined number of times.

If the verification operation using the third MSB verification voltage MPV3 is inhibited, then the process returns to step S321. However, if the verification operation using the third MSB verification voltage MPV3 is not inhibited, the verification operation using the third MSB verification voltage MPV3 is performed, and a result of the verification operation is stored in the node TDL of the second latch L2 at step S371.

It is then determined whether the program operation is a pass by checking whether the data of the latches of all the page buffers PB are all changed to '1' at step S373. If, as a result of the determination at step S373, the program operation is determined to be a pass, the program operation is finished. However, if, as a result of the determination at step S373, the program operation is determined not to be a pass, the process returns to step S321.

In the first embodiment of this disclosure, when performing the double verification operation using the verification operations, respectively using the $0^{th}$ and first MSB verification, on the memory cells programmed to have the fourth threshold voltage distribution 122, the program operation is performed using only the two latches L1, L2.

Table 2 below shows a change in the data state of each of the cases when the program operation is performed according to the first embodiment of this disclosure.

Accordingly, at an early stage, data setting is performed as shown in Table 3 below, so that a bit line coupled to memory cells that should be programmed to have the thirteenth threshold voltage distribution 421 is precharged to the power supply voltage Vcc, and a bit line coupled to memory cells that should be programmed to have the fourteenth to sixteenth threshold voltage distributions 422 to 424 are precharged to 0 V.

TABLE 3

|  | LSB, TDL | BL VOLTAGE |
|---|---|---|
| CASE A | 1, 1 | 0 V |
| CASE B | 0, 0 | 0 V |
| CASE C | 0, 0 | 0 V |
| CASE D | 1, 0 | 0 V |

The program operation according to the second embodiment of this disclosure is described in more detail below.

FIG. 5A is a flowchart illustrating a data setting operation in the MSB page program of the nonvolatile memory device according to the second embodiment of this disclosure.

TABLE 2

| DATA SETTING | | MPV0 (TDL) | | MPV0 (LSB-SO) | | MPV1 (LSB) | | R2 (TDL-SO) | | MPV2 (LSB) | | MPV3 (TDL) | |
|---|---|---|---|---|---|---|---|---|---|---|---|---|---|
| LSB | TDL | LSB | TDL | LSB | TDL | LSB | TDL | LSB | TDL | LSB | TDL | LSB | TDL |
| Case A | 1 | 1 | 1 | 1 | 1 | 1 | 1 | 1 | 1 | 1 | 1 | 1 | 1 | 1 |
| Case B | 0 | 0 | 0 | 1 | 0 | 1 | 1 | 1 | 1 | 1 | 1 | 1 | 1 | 1 |
| Case C | 0 | 1 | 0 | 1 | 0 | 1 | 1 | 1 | 0 | 1 | 1 | 1 | 1 | 1 |
| Case D | 1 | 0 | 1 | 1 | 1 | 0 | 1 | 0 | 1 | 0 | 1 | 0 | 1 | 1 |

A program operation according to a second embodiment in which a double verification operation is performed even in the case of the fifth threshold voltage distribution 123, as well as, the fourth threshold voltage distribution 122 is described below.

Figure 4:
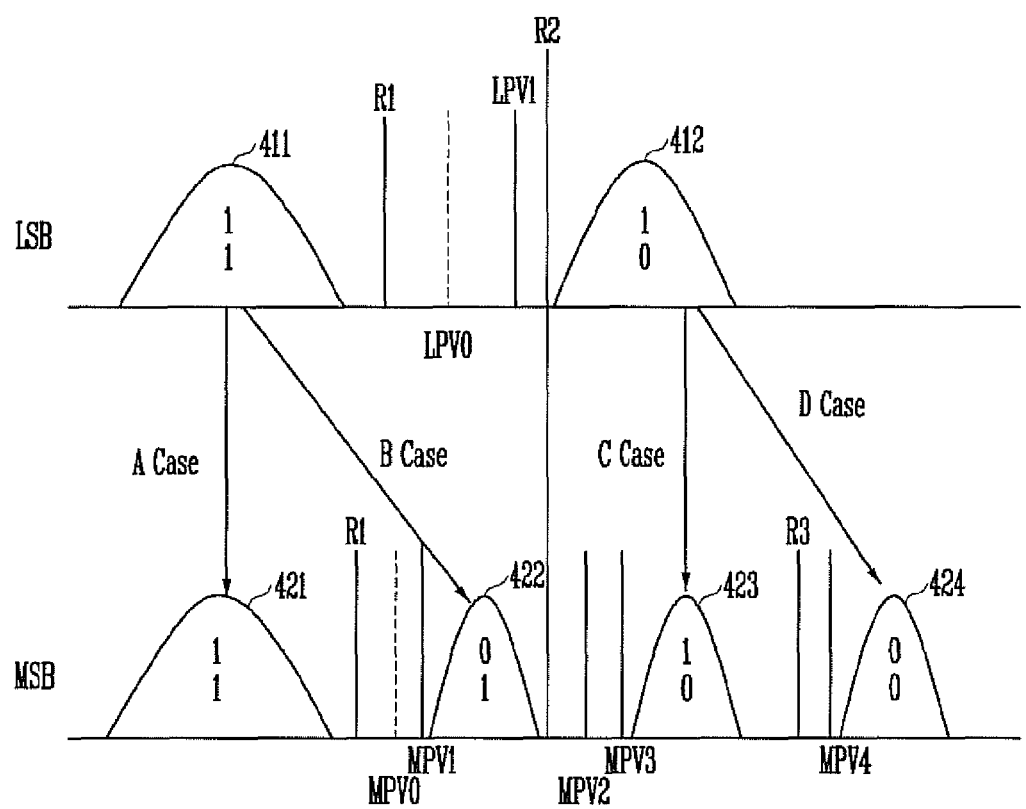
FIG. 4 a diagram showing threshold voltage distributions and verification voltages in an MSB page program according to a second embodiment of this disclosure.

FIG. 4 a diagram showing threshold voltage distributions and verification voltages in an MSB page program according to the second embodiment of this disclosure.

FIG. 4 shows threshold voltage distributions and program verification voltages when the MSB page program is performed after an LSB page program is completed. After the LSB page program is completed, the threshold voltages of the memory cells are classified into eleventh and twelfth threshold voltage distributions 411, 412.

Next, after a predetermined MSB page program is performed, the threshold voltages of the memory cells are classified into thirteenth to sixteenth threshold voltage distributions 421 to 424.

Here, a double verification operation is performed on the fourteenth threshold voltage distribution 422 and the fifteenth threshold voltage distribution 423. To this end, the double verification operation is performed on the fourteenth threshold voltage distribution 422 using the $0^{th}$ and first MSB verification voltages MPV0, MPV1, and the double verification operation is performed on the fifteenth threshold voltage distribution 423 using the second and third MSB verification voltages MPV2, MPV3.

When program operations for the fourteenth threshold voltage distribution 422 and the fifteenth threshold voltage distribution 423 are started, the bit lines are set to 0 V, and the bit line voltage is changed to the first voltage AV while performing the double verification operation.

The second embodiment relates to a program process in the case in which a double verification operation is performed on the memory cells having the fourteenth threshold voltage distribution 422 and the fifteenth threshold voltage distribution 423. FIG. 5A shows a data setting operation for an MSB page program in the state in which an LSB page program has been completed.

In the data setting operation, first, data is inputted to the node LSB of the first latch L1 at step S501. For example, '1010' is inputted to the node LSB according to the first to fourth cases A to D.

Next, the data of the node LSB is copied to the node TDL at step S503. Accordingly, the node LSB and the node TDL of the first and second latches L1, L2 have the data state '1010'.

Next, the data of the node LSB of the first latch L1 is changed according to a result of reading data from the memory cells using the second read voltage R2 at step S505. Thus, the data state of the node LSB is '1000'.

Step S505 is described in more detail. The LSB page program has been completed for the memory cells. Thus, when loading data using the second read voltage R2, the state of the sense node SO in the first to fourth cases A to D becomes '0011'.

The sixth NMOS transistor N6 is turned on or off in response to a state of the sense node SO. Here, when the LSB set signal LSBSET of a high level is inputted, the fifth NMOS transistor N5 is turned on.

Accordingly, with the state of the sense node SO being '0011', the data state '1010' stored in the node LSB is changed to '1000'.

Immediately after step S505, a voltage level of the sense node SO is changed according to a state of the data stored in the node TDL_N, and data according to the voltage level of the sense node SO is stored in the node LSB_N at step S507.

Next, the voltage level of the sense node SO is changed again using the second read voltage R2, and the data of the node TDL is changed according to the voltage level of the sense node SO at step S509. Thus, the data state of the node TDL becomes '1000'.

Accordingly, an initial data setting state is established as shown in Table 3.

In a similar way to the first embodiment, even in the second embodiment, there is a need for a procedure for program-inhibiting the memory cells programmed to have the fifteenth threshold voltage distribution 423.

To this end, a data setting operation using the second MSB verification voltage MPV2 is first performed at step S511, and a data setting operation using the third MSB verification voltage MPV3 is then performed at step S513, thereby completing the data setting operation at step S515.

Step S511 and step S513 of the data setting operation are described in detail below.

First, data of the memory cells are read using the second MSB verification voltage MPV2, and the voltage level of the sense node SO is changed according to the read data. If the threshold voltages of the memory cells have a threshold voltage less than the second MSB verification voltage MPV2, the state of the sense node SO becomes '0'. If the threshold voltages of the memory cells are the second MSB verification voltage MPV2 or more, the state of the sense node SO becomes '1'. Next, the voltage level of the sense node SO is changed according to a state of the data stored in the node LSB_N. Accordingly, when changing the data of the node TDL according to the voltage level of the sense node SO, the data of the node TDL can be prevented from changing in the case of memory cells corresponding to the fourth case D. That is, since the voltage level of the sense node SO is changed using the data of the node LSB_N, the data of the second latch L2, coupled to a page buffer PB with which the memory cells corresponding to the fourth case D are coupled, is not changed.

Furthermore, in the state in which the data of the node TDL has been changed using the second MSB verification voltage MPV2, the data of the node LSB is changed using the third MSB verification voltage MPV3. Accordingly, if all the memory cells corresponding to the third case C have already been programmed, the data of the node LSB and the node TDL are changed to '1', thereby being program-inhibited.

After the data setting operation is completed as described above, a bit line precharge operation is performed.

The bit line precharge operation is identical with that of the first embodiment of this disclosure.

Figure 5B:
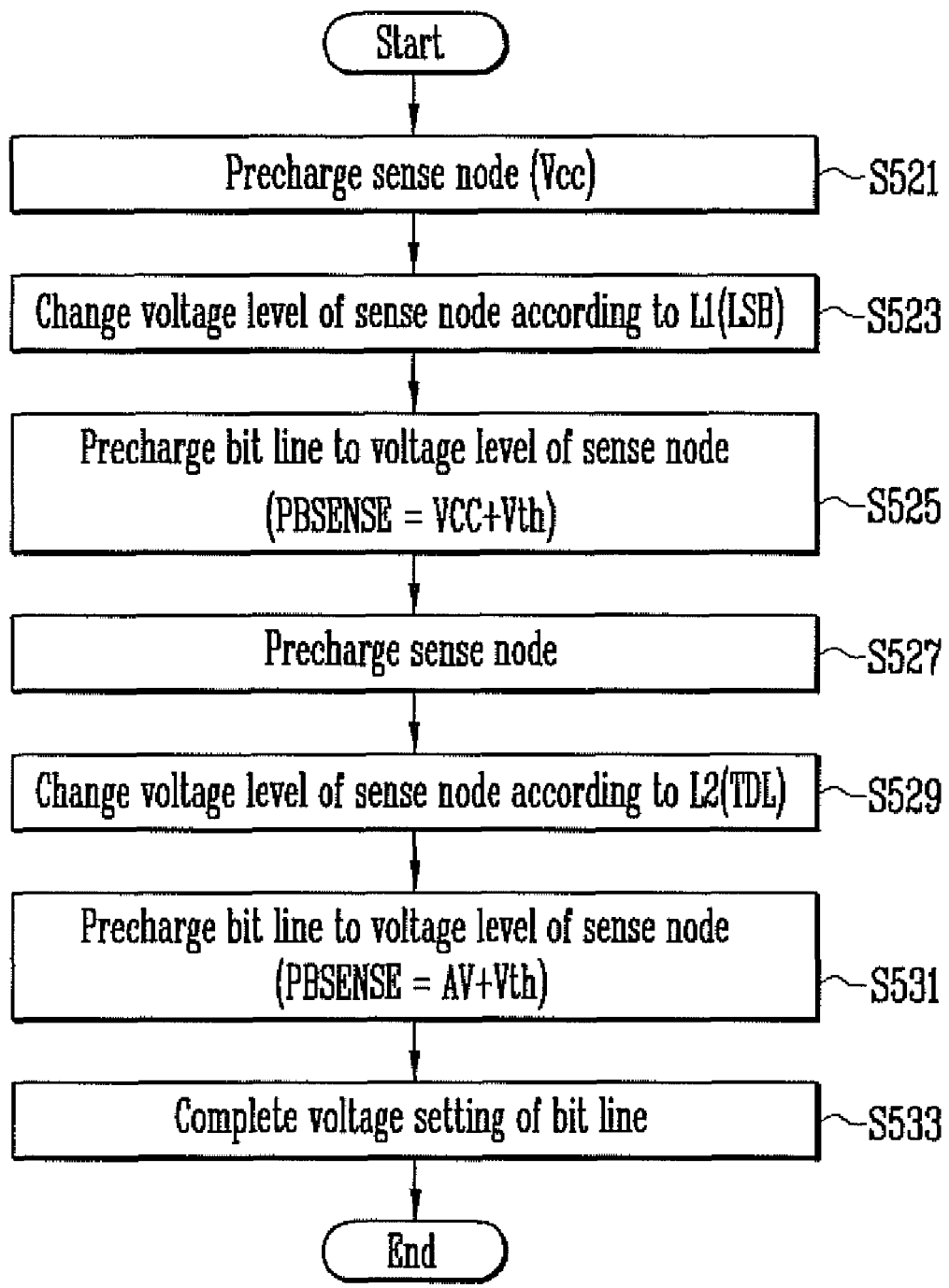
FIG. 5B is a flowchart illustrating a bit line voltage setting operation subsequent to the data setting operation shown in FIG. 5A.

FIG. 5B is a flowchart illustrating a bit line voltage setting operation subsequent to the data setting operation shown in FIG. 5A.

Referring to FIG. 5B, after the data setting operation for the first and second latches L1, L2 in each of the first to fourth cases A to D is completed, the bit line precharge operation is started.

To this end, first, the sense node SO is precharged to the power supply voltage Vcc in response to the precharge control signal PRECH_N of a low level at step S521.

Next, the third NMOS transistor N3 is turned on in response to the second control signal LSB_SO of a high level. When the third NMOS transistor N3 is turned on, the voltage level of the sense node SO is changed according to a state of data stored in the node LSB at step S523.

That is, when the sense node SO precharged to the power supply voltage Vcc is coupled to the node LSB, the voltage levels of the sense nodes SO are changed to 'Vcc', '0' V, '0' V, and 'Vcc' according to the data state '1001' of the node LSB. Next, the level of the second control signal LSB_SO is changed into a low level, and so the third NMOS transistor N3 is turned off.

Next, the bit lines coupled to the memory cells are precharged in response to the sense control signal PBSENSE of a voltage level 'Vcc+Vth' at step S525. When the sense control signal PBSENSE of the voltage level 'Vcc+Vth' is applied, the voltage level of the sense node SO is precharged in the bit lines without a voltage drop.

That is, the bit lines are precharged to 'Vcc', '0' V, '0' V, and 'Vcc' in the first to fourth cases A to D, respectively.

Next, the sense node SO is precharged to the power supply voltage Vcc in response to the precharge control signal PRECH_N of a low level at step S527. Thereafter, the eighth NMOS transistor N8 is turned on in response to the fourth control signal TDL_SO of a high level, and the voltage level of the sense node SO is changed according to a state of the data stored in the node TDL at step S529.

Since the data state of the node TDL is '1000', the voltage levels of the sense nodes SO are changed to 'Vcc', '0' V, '0' V, and '0' V. Next, the level of the fourth control signal TDL_SO is changed to a low level, and so the eighth NMOS transistor is turned off.

Next, the first NMOS transistor N1 is turned on in response to the sense control signal PBSENSE of a voltage level 'AV+Vth' at step S531.

When the sense control signal PBSENSE of the voltage level 'AV+Vth' is applied, the bit lines are precharged to AV even though the sense node SO has the power supply voltage Vcc. Here, AV has a voltage level less than the power supply voltage Vcc. The voltage AV is used to precharge a bit line to a low voltage level, so that the bit line is more slowly programmed than other bit lines in order for the memory cells, having the fifteenth threshold voltage distribution 123, to be reprogrammed.

Accordingly, the voltage levels of the bit lines, being 'Vcc', '0' V, '0' V, and 'Vcc' at step S523, are changed in 'Vcc', '0' V, 'AV', and 'Vcc' at step S531. It can be seen that the voltage levels of the bit lines are set to be identical with those of the first to fourth cases, as defined in Table 1, when the program operations are started.

Accordingly, the bit line voltage setting operation for starting a program operation is completed at step S533.

After the bit line voltage setting operation is completed as described above, program and verification operations are performed according to a program pulse.

Figure 5C:
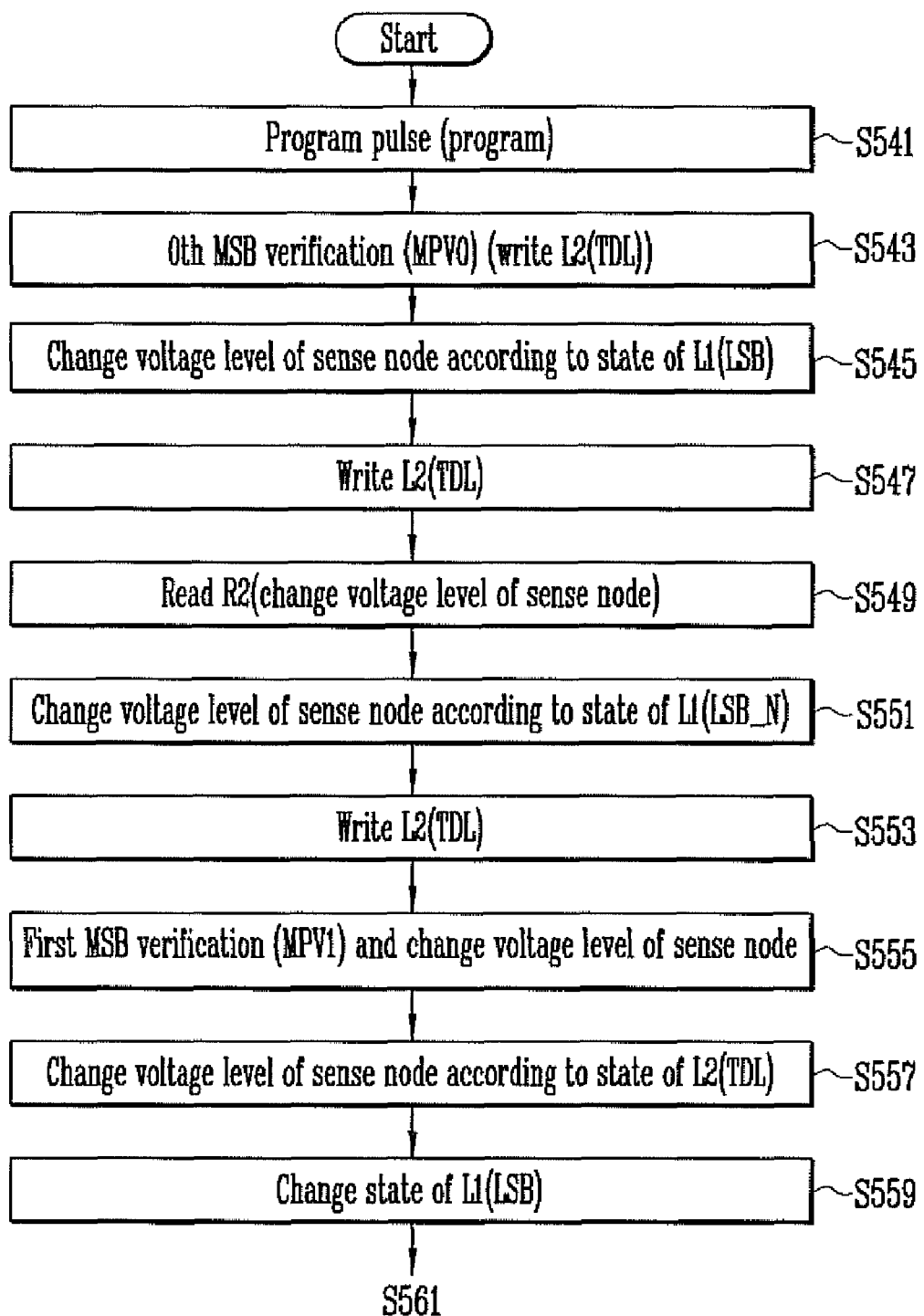
FIG. 5C is a flowchart illustrating a first double verification operation subsequent to the bit line voltage setting operation shown in FIG. 5B.

FIG. 5C is a flowchart illustrating a first double verification operation subsequent to the bit line voltage setting operation shown in FIG. 5B.

Referring to FIG. 5C, when a program pulse is applied at step S541, a program operation is performed on selected memory cells. The program operation is identical with the program operation of a known nonvolatile memory device.

Next, a verification operation is performed. In the second embodiment of this disclosure, a double verification operation using the $0^{th}$ and first MSB verification voltages MPV0, MPV1 is performed.

First, a verification operation using the $0^{th}$ MPV verification voltage MPV0 is performed, and a result of the verification operation is stored in the node TDL of the second latch L2 at step S543. Here, cases whose data states are unwantedly changed by the $0^{th}$ MPV verification voltage MPV0 correspond to the third and fourth cases C and D. To correct the fourth case D, the voltage level of the sense node SO is changed according to a state of data stored in the node LSB of the first latch L1 at step S545, and a write operation is then performed on the node TDL of the second latch L2 at step S547. Accordingly, when the node TDL becomes '1111' as a result of the verification operation using the $0^{th}$ MPV verification voltage MPV0, the node TDL becomes '1110' according to steps S545 and S547.

Next, to correct the third case C, the voltage level of the sense node SO is changed using the second read voltage R2 at step S549, and the voltage level of the sense node SO is changed again according to a state of the data stored in the node LSB_N of the first latch L1 at step S551. Next, the data of the node TDL is changed according to the voltage level of the sense node SO and then stored in the second node L2 at step S553. Accordingly, the data state of the node TDL becomes '1100'.

After the verification operation using the $0^{th}$ MSB verification voltage MPV0 is finished, the voltage level of the sense node SO is changed by performing a verification operation using the first MSB verification voltage MPV1 at step S555, and the voltage level of the sense node SO is changed according to a state of the data stored in the node TDL at step S557.

If the verification operation using the first MSB verification voltage MPV1 is performed without change, cases that become a pass by the first MSB verification voltage MPV1 correspond to the second to fourth cases B to D. Here, although the fourth case D is a pass, there is no problem because the data of the node LSB is already '1'. However, the third case C should maintain the state '0'. Accordingly, to prevent the data state of the third case C from changing, steps S555 and S557 are performed.

Next, the data of the node LSB is changed according to the voltage level of the sense node SO, changed at step S557, at step S559.

If the voltage level of the sense node SO is changed using the first MSB verification voltage MPV1, the second to fourth cases B to D can have the state '1'. However, the states of the third and fourth cases C, D should not be changed.

Accordingly, if the voltage level of the sense node SO is changed according to a state of data stored in the node TDL, the state of the sense node SO becomes '0100'. Consequently, only the second case B can be verified. Accordingly, the third and fourth cases C, D are not influenced by the first MSB verification voltage MPV1.

When the second case B becomes a pass by the first MSB verification voltage MPV1, the data state of the node LSB becomes '1101'.

Figure 5D:
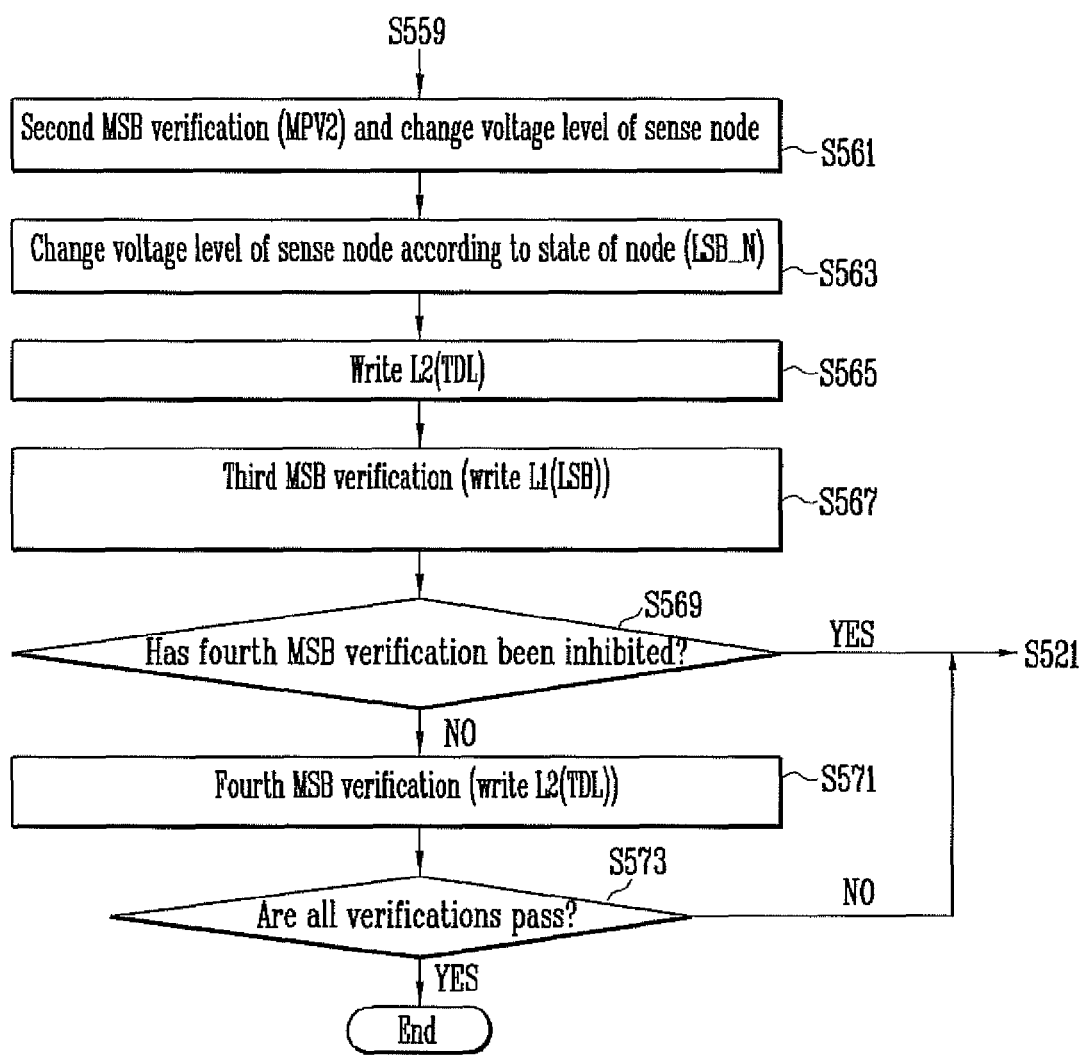
FIG. 5D is a flowchart illustrating a second double verification operation subsequent to the first double verification operation shown in FIG. 5C.

FIG. 5D is a flowchart illustrating a second double verification operation subsequent to the first double verification operation shown in FIG. 5C.

Referring to FIG. 5D, after the double verification operation using the $0^{th}$ and first MSB verification voltages MPV0, MPV1, a double verification operation using the second and third MSB verification voltages MPV2, MPV3 should be performed.

Here, the third and fourth cases C, D become a pass when a verification operation using the second MSB verification voltage MPV2 is performed and a result of the verification operation is stored in the node TDL. Also, the data state of the fourth case D should not be changed.

To this end, the verification operation using the second MSB verification voltage MPV2 is not performed as it is. Instead, the voltage level of the sense node SO is first changed in response to the second MSB verification voltage MPV2 at step S561, and the voltage level of the sense node SO is then changed according to a state of data stored in the node LSB_N at step S563.

When the voltage level of the sense node SO is, for example, '0011', a result becomes a pass at step S561. Furthermore, when step S563 is performed, the state of the sense node SO becomes '0010'. Accordingly, a result of the verification operation is stored only in the third case C.

Accordingly, the data of the node TDL is changed according to the voltage level of the sense node SO, changed at step S563, and then stored in the second latch at step S565. Thus, when the verification operation using the second MSB verification voltage MPV2 is a pass, the data state of the node TDL becomes '1110'.

A verification operation using the third MSB verification voltage MPV3 is then performed. A result of the verification operation using the third MSB verification voltage MPV3 is stored in the node LSB. The third and fourth cases C, D become a pass by the third MSB verification voltage MPV3.

Here, the fourth case D is not influenced although its data state is changed to a pass because the data of the node LSB is already '1'. Accordingly, a result of the verification operation using the third MSB verification voltage MPV3 is stored in the node LSB without change at step S567.

It is then determined whether a verification operation using the fourth MSB verification voltage MPV4 has been inhibited at step S569. If, as a result of the determination, the verification operation is determined not to be inhibited, the verification operation using the fourth MSB verification voltage MPV4 is performed, and so the data of the node TDL is changed at step S571.

The determination in step S569 is made in order to preclude the verification operation using the fourth MSB verification voltage MPV4, when a program pulse is applied by a predetermined number of times. Accordingly, if, as a result of the determination at step S569, the verification operation is determined to be inhibited, the process returns to step S521 (i.e., the bit line voltage setting process) in which a program operation is performed again. In the program operation, since the data of the first and second latches L1, L2 of the page buffer PB have been changed according to a result of the verification operation, the bit lines may be precharged to AV according to states of data stored in the latches in the case in which a double verification operation should be performed.

It is then determined whether the verification operations using the $0^{th}$ to fourth MSB verification voltages MPV0 to MPV4 are a pass at step S573. If, as a result of the determination, all the verification operations using the $0^{th}$ to fourth MSB verification voltages are determined to be a pass, the program operation is finished. However, if, as a result of the determination, not all the verification operations using the $0^{th}$ to fourth MSB verification voltages are determined to be a pass, the process returns to step S521.

Table 4 below shows a change in the data states of the nodes LSB, TDL resulting from the program operation performed according to the second embodiment of this disclosure.

TABLE 4

| DATA SETTING | | MPV0 (TDL) | | R2 (TDL) | | MPV1 (LSB) | | MPV2 (TDL) | | MPV3 (LSB) | | MPV4 (TDL) | |
|---|---|---|---|---|---|---|---|---|---|---|---|---|---|
| LSB | TDL | LSB | TDL | LSB | TDL | LSB | TDL | LSB | TDL | LSB | TDL | LSB | TDL |
| Case A | 1 | 1 | 1 | 1 | 1 | 1 | 1 | 1 | 1 | 1 | 1 | 1 | 1 | 1 |
| Case B | 0 | 0 | 0 | 1 | 0 | 1 | 0 | 1 | 1 | 1 | 1 | 1 | 1 | 1 |
| Case C | 0 | 0 | 0 | 1 | 0 | 0 | 0 | 0 | 0 | 1 | 1 | 1 | 1 | 1 |
| Case D | 1 | 0 | 1 | 0 | 1 | 0 | 1 | 0 | 1 | 0 | 1 | 0 | 1 | 1 |

In accordance with the program methods of the first and second embodiments of this disclosure, when a verification operation is performed, a program state is read in a memory cell, if needed, without using an additional latch for storing flag information indicative of a LSB program state. Accordingly, the number of latches can be reduced, and errors do not occur when a double verification operation is performed using a memory cell as one latch.

As described above, since a memory cell of a nonvolatile memory device is used as one latch, several verification operations can be performed using only a small number of latches.

What is claimed is:

1. A method of sequentially performing a least significant bit (LSB) program operation and a most significant bit (MSB) program operation of a nonvolatile memory device, wherein the nonvolatile memory device comprises multi-level memory cells each configured to store two pieces of bit information and page buffers each coupled to a bit line coupled to the memory cells and configured to comprise a first latch coupled to first and second nodes and a second latch coupled to third and fourth nodes, the method comprising:

a data setting step of inputting data of MSBs to the second and fourth nodes and setting data of the second and fourth nodes according to a state of data of LSBs stored in the memory cells; and a bit line precharge step of precharging the bit line according to a combination of data stored in the first and second latches and performing the MSB program operation according to a state of a LSB program operation stored in the memory cells.

2. The method of claim 1, wherein the data setting step comprises the steps of:

inputting the data of MSBs to the second node;

copying the data of the second node to the fourth node;

changing the data of the second node according to a state of the data stored in the memory cells read using a first read voltage; and changing a voltage level of a sense node, which was previously changed according to a result of the data read using the first read voltage, according to a state of data stored in the third node, and then changing data of the first node according to the changed voltage level of the sense node.

3. The method of claim 2, wherein the step of precharging the bit line comprises the steps of:

precharging the bit line to a power source voltage or 0 V according to the data stored in the second node; and precharging the bit line to the power source voltage, a first voltage, or 0 V according to the data stored in the fourth node.

4. The method of claim 3, wherein the step of performing the MSB program operation comprises:

a MSB program step of performing a program operation using a first program voltage for the memory cells in response to a program pulse;

a first MSB verification step of storing a result of performing a first verification operation using a first verification voltage in the fourth node, and then changing the data of the fourth node according to a state of the data stored in the second node;

a second MSB verification step of storing a result of performing a second verification operation using a second verification voltage in the second node, and then changing the data of the second node according to a state of the data stored in the fourth node and a program state of the memory cells, determined using the first read voltage, where the second verification voltage is less than the first read voltage, which is less than a third verification voltage;

a third MSB verification step of storing a result of performing a third verification operation using a third verification voltage in the second node;

a fourth MSB verification step of storing a result of performing a fourth verification operation using a fourth verification voltage in the fourth node; and a finish step of finishing the program operation, if all results of performing the first to fourth MSB verification steps are a pass.

5. The method of claim 4, further comprising the step of changing the data of the second node by performing a data verification operation using the third verification voltage after the data setting step, but before performing the program operation using the first program.

6. The method of claim 5, wherein the first MSB verification step comprises the steps of:

performing a first verification operation using the first verification voltage and storing a result of the first verification operation in the fourth node;

changing the voltage level of the sense node, depending on the result of the first verification operation, according to a state of the data stored in the second node; and changing the data of the fourth node according to the voltage level of the sense node, after the changing of the voltage level of the sense node.

7. The method of claim 6, wherein the second MSB verification step comprises the steps of:

performing a second verification operation using the second verification voltage and storing a result of the second verification operation in the second node;

changing the voltage level of the sense node according to a state of the data stored in the memory cells using the first read voltage;

changing the voltage level of the sense node according to a state of the data stored in the fourth node; and changing the data of the second node according to the voltage level of the sense node, after the changing of the voltage level of the sense node according to a state of the data stored in the fourth node.

8. The method of claim 7, further comprising:
repeating a program operation using a second program voltage higher than the first program voltage, if all results of performing the first to fourth MSB verification steps are not a pass; and
repeating the first to fourth MSB verification operations.

9. The method of claim 8, wherein the first to fourth verification voltages have different voltage levels, which increase in that order.

10. The method of claim 9, wherein the first read voltage is higher than the second verification voltage and lower than the third verification voltage.

11. The method of claim 9, wherein:
the fourth MSB verification step is not performed until the program pulse is applied by a predetermined number of times or more, and
each time the program operation is performed the program voltage is higher.

12. The method of claim 1, wherein the data setting step comprises the steps of:
inputting the data of MSBs to the second node;
copying the data of the second node to the fourth node;
changing the data of the second node according to a state of the data stored in the memory cells and read using a first read voltage;
changing a voltage level of the sense node, changed according to a result of the data read using the first read voltage, according to a state of data stored in the third node; and
changing a state of the data stored in the fourth node using the first read voltage.

13. The method of claim 12, wherein the step of performing the MSB program operation comprises:
a precharging step of precharging the bit line according to the states of the data stored in the second and fourth nodes;
a MSB program step of performing a program operation using a first program voltage for the memory cells in response to a program pulse;
a first MSB verification step of performing a first verification operation using a first verification voltage in the fourth node, and then changing the data of the fourth node according to the state of the data stored in the second node;
a second MSB verification step of performing a second verification operation using a second verification voltage in the second node, and then changing the data of the second node according to the state of the data stored in the fourth node and a program state of the memory cells, determined using the first read voltage, where the second verification voltage is less than the first read voltage, which is less than a third verification voltage;
a third MSB verification step of changing the voltage level of the sense node using the third verification voltage, changing the changed voltage level of the sense node according to the state of the data stored in the first node, and then changing the data of the fourth node according to the changed voltage level of the sense node;
a fourth MSB verification step of changing the data of the second node using a fourth verification voltage;
a fifth MSB verification step of changing the data of the fourth node using a fifth verification voltage; and
a finishing step of finishing the program operation, if all results of performing the first to fifth MSB verification steps are a pass.

14. The method of claim 13, further comprising:
changing the data of the fourth node by performing a data verification operation using the third verification voltage after the data setting step is performed, but before the performing of the program operation using the first program voltage; and
changing the data of the second node by performing a data verification operation using the fourth verification voltage.

15. The method of claim 14, wherein the first MSB verification step comprises the steps of:
performing a first verification operation using the first verification voltage and storing a result of the first verification operation in the fourth node;
changing the voltage level of the sense node, depending on the result of the first verification operation, according to the state of the data stored in the second node;
changing the data of the fourth node according to the voltage level of the sense node, after the changing of the voltage level of the sense node according to the state of the data stored in the second node; and
changing the voltage level of the sense node using the first read voltage, then changing the voltage level of the sense node according to a state of data stored in the first node, and then changing the data of the fourth node according to the voltage level of the sense node.

16. The method of claim 15, wherein the second MSB verification step comprises the steps of:
changing the voltage level of the sense node using the second verification voltage;
changing the voltage level of the sense node according to the state of the data stored in the fourth node; and
changing the data of the second node according to the voltage level of the sense node, after the changing of the voltage level of the sense node according to the state of the data stored in the fourth node.

17. The method of claim 16, wherein the third MSB verification step comprises the steps of:
changing the voltage level of the sense node using the third verification voltage;
changing the voltage level of the sense node according to the state of the data stored in the first node; and
changing the data of the fourth node according to the voltage level of the sense node, after the changing of the voltage level of the sense node according to the state of the data stored in the first node.

18. The method of claim 17, further comprising the steps of:
precharging the bit line and repeating a program operation using a second program voltage higher than the first program voltage, if all results of performing the first to fifth MSB verification steps are not a pass; and
repeating the first to fifth MSB verification operations.

19. The method of claim 18, wherein the first to fifth verification voltages have different voltage levels, which increase in that order.

20. The method of claim 18, wherein the first read voltage is higher than the second verification voltage and lower than the third verification voltage.

21. The method of claim 18, wherein:
the fifth MSB verification step is not performed until the program pulse is applied by a predetermined number of times or more, and each time the program operation is performed the program voltage is higher.

22. A method of sequentially performing a LSB program operation and an MSB program operation of a nonvolatile memory device, wherein the nonvolatile memory device comprises multi-level memory cells each configured to store two pieces of bit information and page buffers each coupled to a bit line coupled to the memory cells and configured to comprise a first latch coupled to first and second nodes and a second latch coupled to third and fourth nodes, the method comprising:

a data setting step of inputting data of MSBs to the second and fourth nodes and setting data of the second and fourth nodes according to a state of data of LSBs stored in the memory cells;

a bit line precharge step of precharging the bit line to a power supply voltage, a first voltage, or 0 V according to states of the data stored in the second and fourth nodes;

a first MSB verification step of performing a program operation using a first program voltage in response to a program pulse, performing a first verification operation using a first verification voltage in the fourth node, and then changing the data of the fourth node according to the state of the data stored in the second node;

a second MSB verification step of performing a second verification operation using a second verification voltage for the second node, and changing the data of the second node according to the state of the data stored in the fourth node and a program state of the memory cells, determined using the first read voltage, where the second verification voltage is less than the first read voltage, which is less than a third verification voltage;

a third MSB verification step of performing a third verification operation using a third verification voltage for the second node;

a fourth MSB verification step of performing a fourth verification operation using a fourth verification voltage for the fourth node; and a finishing step of finishing the program operation, if all results of performing the first to fourth MSB verification steps are a pass.

23. A method of sequentially performing a LSB program operation and an MSB program operation of a nonvolatile memory device, wherein the nonvolatile memory device comprises multi-level memory cells each configured to store two pieces of bit information and page buffers each coupled to a bit line coupled to the memory cells and configured to comprise a first latch coupled to first and second nodes and a second latch coupled to third and fourth nodes, the method comprising:

a data setting step of inputting data of MSBs to the second and fourth nodes and setting data of the second and fourth nodes according to a state of data of LSBs stored in the memory cells;

a bit line precharge step of precharging the bit line to a power supply voltage, a first voltage, or 0 V according to states of the data stored in the second and fourth nodes;

a first MSB verification step of performing a program operation using a first program voltage in response to a program pulse, performing a first verification operation using a first verification voltage in the fourth node, and then changing the data of the fourth node according to the state of the data stored in the second node;

a second MSB verification step of performing a second verification operation using a second verification voltage for the second node, and changing the data of the second node according to the state of the data stored in the fourth node and a program state of the memory cells, determined using the first read voltage, where the second verification voltage is less than the first read voltage, which is less than a third verification voltage;

a third MSB verification step of changing the voltage level of the sense node using the third verification voltage, then changing the voltage level of the sense node according to a state of data stored in the first node, and then changing the data of the fourth node according to the voltage level of the sense node;

a fourth MSB verification step of changing the data of the second node using a fourth verification voltage;

a fifth MSB verification step of changing the data of the fourth node using a fifth verification voltage; and a finishing step of finishing the program operation, if all results of performing the first to fifth MSB verification steps are a pass.

* * * * *